(12) United States Patent
Donofrio et al.

(10) Patent No.: US 7,786,431 B1
(45) Date of Patent: Aug. 31, 2010

(54) MAGNETICALLY MODULATED, SPIN VECTOR CORRELATED BEAM GENERATOR FOR PROJECTING ELECTRICALLY RIGHT, NEUTRAL, OR LEFT BEAMS

(76) Inventors: Raymond S. Donofrio, 20017 Mustang Ct., Sun City, AZ (US) 85373; Richard von Hack-Prestinary, 1013 Bridgeway Blvd., Orlando, FL (US) 32828; Larry Fullerton, 125 Peter Ln., New Hope, AL (US) 35760

( * ) Notice: Subject to any disclaimer, the term of this patent is extended or adjusted under 35 U.S.C. 154(b) by 254 days.

(21) Appl. No.: 12/140,974

(22) Filed: Jun. 17, 2008

Related U.S. Application Data

(60) Provisional application No. 60/944,507, filed on Jun. 17, 2007.

(51) Int. Cl.
 *H01J 37/08* (2006.01)
(52) U.S. Cl. .................... 250/251; 250/423 R; 250/424; 250/493.1; 313/111; 313/363.1; 313/359.1
(58) Field of Classification Search .................. 250/251
 See application file for complete search history.

(56) References Cited

U.S. PATENT DOCUMENTS

| | | | | |
|---|---|---|---|---|
| 3,116,433 A | * | 12/1963 | Moncrieff-Yeates | ... 315/111.01 |
| 3,846,636 A | * | 11/1974 | Zehr et al. | .................. 376/156 |
| 3,931,589 A | | 1/1976 | Aisenberg et al. | |
| 4,395,631 A | * | 7/1983 | Salisbury | ...................... 250/251 |
| 4,447,732 A | * | 5/1984 | Leung et al. | ................. 250/427 |
| 4,447,761 A | * | 5/1984 | Stinnett | ................. 315/111.81 |
| 4,529,571 A | * | 7/1985 | Bacon et al. | ................. 376/144 |
| 4,749,857 A | * | 6/1988 | Druaux | ........................ 250/251 |
| 4,793,961 A | * | 12/1988 | Ehlers et al. | ................. 376/127 |
| 4,847,504 A | * | 7/1989 | Aitken | ...................... 250/492.2 |
| 4,894,199 A | * | 1/1990 | Rostoker | ..................... 376/107 |
| 5,198,677 A | * | 3/1993 | Leung et al. | ................. 250/424 |
| 5,206,504 A | * | 4/1993 | Sridharan | ................... 250/251 |
| 5,216,241 A | * | 6/1993 | Hatakeyama et al. | ....... 250/251 |
| 5,531,420 A | * | 7/1996 | Benveniste | ................... 250/251 |
| 5,859,428 A | * | 1/1999 | Fruchtman | ................... 250/251 |
| 6,137,246 A | * | 10/2000 | Suzuki | ........................ 315/507 |
| 6,285,025 B1 | * | 9/2001 | Metel et al. | .................. 250/251 |
| 6,813,076 B2 | * | 11/2004 | Okubo et al. | ................ 359/484 |
| 6,858,838 B2 | * | 2/2005 | Ichiki et al. | .................. 250/251 |
| 6,974,950 B2 | * | 12/2005 | Leung et al. | ................. 250/251 |
| 7,453,076 B2 | * | 11/2008 | Welch et al. | .................. 250/492.3 |
| 7,501,640 B2 | * | 3/2009 | Larson | ........................ 250/489 |
| 2002/0134939 A1 | * | 9/2002 | Giedd | ........................ 250/338.1 |
| 2002/0150193 A1 | * | 10/2002 | Leung et al. | ................. 376/108 |

* cited by examiner

*Primary Examiner*—David A Vanore
(74) *Attorney, Agent, or Firm*—Keith L. Jenkins, Registered Patent Attorney, LLC; Keith L. Jenkins

(57) ABSTRACT

A beam generator for generating an electrically neutral dual-particle (proton and electron) beam with a uniform magnetic pole orientation imposed on the particles. The uniform orientation gives the dual-particle beam a uniform magnetic field, enabling magnetic modulation of the beam and making the beam self-collimating. Proton and electron beams are generated separately but under common control to ensure equal particle densities to ensure net electrical neutrality when combined. The proton and electron beams may also be concurrently magnetically or electrostatically modulated before being combined. A magnetic lens imposes uniform right, neutral, or left spin on the combined beam. A resonant chamber with fixed or variable resonant frequency determines the frequency of a carrier signal modulated by the modulated combined beam. Electric neutrality prevents detection of the beam with antennas that rely on a signal inducing a voltage on a conductor.

20 Claims, 4 Drawing Sheets

MAGNETICALLY MODULATED, SPIN VECTOR CORRELATED BEAM GENERATOR FOR PROJECTING ELECTRICALLY RIGHT, NEUTRAL, OR LEFT BEAMS

RELATED APPLICATIONS

This application claims the benefit of provisional application Ser. No. 60/944,507 for Magnetically Modulated, Spin Vector Correlated, Beam Generator For Projecting Electrically Right, Neutral, Or Left Beams filed on Jun. 17, 2007 in the names of the present inventors.

STATEMENT REGARDING FEDERALLY SPONSORED RESEARCH

No federal research funds were used in the development of this invention.

FIELD OF THE INVENTION

The present invention generally relates to beam generating devices. The present invention more particularly relates to a beam generator that may be used to generate an electrically right, neutral, or left beam that is spin-vector correlated and magnetically modulated.

BACKGROUND OF THE INVENTION

Beam generators are used to produce electromagnetic beams at various wavelengths, frequencies and power levels for various purposes. Beam generators fall into multiple classes to include low noise amplifiers (LNA), high power amplifiers (HPA) which include solid state power amplifiers (SSPA), traveling wave tube amplifiers, (TWTA) and klystrons and, in the optical wavelengths, erbium-doped fiber amplifiers (EDFAs) and High-power solid-state laser amplifiers (HPSSLA) are a few examples. The characteristics of the magnetic component of the electromagnetic beam has historically been resistant to fine control due to noise sources inherent in the generating processes. Conventional beam generators such as traveling wave tubes and/or klystrons require a substantial amount of power to generate the bias current necessary for traditional beam generation. The bias current is used to produce a magnetic field of sufficient density to contain and manage electron beam divergence over beam travel distance in a vacuum chamber to specified parameters. The operational output efficiency of conventional beam generation devices is compromised by the often large power draw necessary for the bias current; another consequence of conventional beam generation is the inherent introduction of noise. Typical beam generators have an output efficiencies ranging from 30-to-35% and may require significant power conditioning and/or signal processing to eliminate noise. If such a magnetically modulated beam could be created, information modulated onto it could (theoretically) not be detected without a priori knowledge of the beam characteristics, making it extremely difficult to intercept when used, for example, as a communication beam. Practice has not lived up to theory, and a need for a beam generator controllable to efficiently and reliably produce a magnetically modulated beam has not been commercialized.

Beams of interest may include particle beams or electromagnetic beams in any portion of the electromagnetic spectrum. Having a single beam-generating device (hereinafter "BGD") for all portions of the electromagnetic spectra and for particle beam generation would be economically advantageous.

SUMMARY OF THE INVENTION

In order to solve the aforementioned problems, meet the aforementioned needs, and for other advantages, as will become apparent, the inventors provide an efficient and reliable neutral beam generator suitable for dual use purposes. The invention is applicable across most of the electromagnetic spectrum. A first embodiment of the invention is adapted to produce a dual-particle beam. The invention includes an electron source and a separate proton source whose emissions are each controlled to a uniform magnetic orientation and to equal particle densities. The oriented protons and electrons are accelerated and may be magnetically modulated with an external mission waveform. The oriented particles are combined to make a combined beam that is electrically neutral. The combined beam passes through a magnetic lens, preferably in a cavity resonator, to correlate the spin states of the particles to be uniformly right, neutral, or left spin. The spin-correlated particles (protons and electrons) form an electrically-neutral, magnetically-modulated beam and enter a cavity resonator achieve a desired frequency. Finally, the beam is passed through the legacy or new system duplexer and then on through the mission aperture. A second embodiment produces a neutral particle beam. When operated in the neutral beam mode the beam generator uses a ballistically propelled electrically neutral beam that is encapsulated by its inherent magnetic field that controls divergence over beam travel distance in a vacuum chamber to specified parameters. Since the beam generator does not require a bias current, it is expected that beam generator output efficiency and noise reduction will greatly exceed that of conventional beam generation devices. A third embodiment produces an electrically right or neutral beam. A fourth embodiment produces an electrically right, left, or neutral beam.

A magnetically modulated, spin vector correlated, self-collimating beam generator for projecting electrically right, neutral, or left beams, the beam generator including: a proton beam generator able to produce a proton beam having a uniform magnetic field by uniformly orienting the protons in the proton beam; an electron beam generator able to produce an electron beam having a uniform magnetic field by uniformly orienting the electrons in the electron beam; wherein the proton beam generator and the electron beam generator are coupled to a controller, and further wherein the proton beam generator and the electron beam generator are controllable to supply beams of equal particle densities.

The proton beam generator includes: a proton source; an anode-coupled orientation tube able to receive the protons from the proton source, accelerate the received protons toward a proton aperture, and orient the received protons into a uniform orientation. The proton beam generator further includes: a proton-beam magnetic modulator, able to magnetically modulate the uniformly-oriented proton beam, first beam steering means, able to steer the magnetically-modulated, uniformly-oriented proton beam towards the proton aperture; and at least one first hydrogen scrubber, able to assist in removing hydrogen from the magnetically-modulated, uniformly-oriented proton beam.

The electron beam generator includes: an electron source, a cathode-coupled orientation tube able to, receive the electrons from the electron source, accelerate the received electrons toward an electron aperture, and orient the received electrons into a uniform orientation. The electron beam generator further includes: an electron-beam magnetic modulator, able to concurrently magnetically modulate the uniformly-oriented electron beam; second beam steering means, able to steer the magnetically-modulated, uniformly-oriented electron beam towards the electron aperture; and at least one second hydrogen scrubber, able to assist in removing hydrogen from the magnetically-modulated, uniformly-oriented electron beam.

The beam generator further includes at least one of a first modulator, able to concurrently modulate the uniformly-oriented proton beam and the uniformly-oriented electron beam by concurrently influencing the uniform magnetic field of the uniformly-oriented proton beam and the uniform magnetic field of the uniformly-oriented electron beam; and a combiner having a second modulator, able to produce and modulate a combined beam comprised of the uniformly-oriented proton beam and the uniformly-oriented electron beam and having a combined-beam uniform magnetic field, wherein the second modulator is able to magnetically modulate the uniformly-oriented combined beam by influencing the combined-beam uniform magnetic field.

The beam generator further includes a combiner for combining the uniformly-oriented proton beam and the uniformly-oriented electron beam to produce an electrically neutral, uniformly-oriented combined beam having a combined-beam uniform magnetic field, wherein the protons and the electrons remain discrete particles in the electrically neutral, uniformly-oriented combined beam. The beam generator further includes a combined-beam modulator, able to influence the combined-beam uniform magnetic field. The beam generator further includes a magnetic lens able to correlate the spin states of the electrons and the protons by influencing the protons in the magnetically-modulated, electrically neutral, uniformly-oriented combined beam towards a predetermined spin vector state and influencing the electrons in the magnetically-modulated, electrically neutral, uniformly-oriented combined beam towards the predetermined spin vector state. The predetermined spin vector state includes left, right. or neutral spin.

The beam generator may further include a resonant cavity, able to: receive the magnetically-modulated, electrically neutral, uniformly-oriented combined beam; modulate a cavity-generated resonant frequency electromagnetic carrier with the magnetically-modulated, electrically neutral, uniformly-oriented, self-collimating combined beam to produce a modulated cavity-generated resonant frequency electromagnetic signal; and provide an output aperture for the modulated cavity-generated resonant frequency electromagnetic signal. The resonant cavity includes: a magnetic lens able to: influence the protons in the magnetically-modulated, electrically neutral, uniformly-oriented combined beam towards a predetermined spin vector state; and influence the electrons in the magnetically-modulated, electrically neutral, uniformly-oriented combined beam towards the predetermined spin vector state; a ceramic resonator, selectable and controllable to determine a resonant frequency in the resonant cavity. The resonant cavity further includes: a receiving antenna, able to receive signals entering the resonant cavity; and a probe, able to sample at least one state within the resonant cavity.

The beam generator may further include a duplexer having a duplexer input aperture and a duplexer output aperture, able to receive the oscillating, magnetically-modulated, electrically neutral, uniformly-oriented, spin-vector correlated combined beam through the legacy or new system duplexer input aperture and to receive another oscillating combined beam through the legacy or new duplexer output aperture.

A magnetically modulated, spin vector correlated, self-collimating beam generator for projecting electrically right, neutral, or left beams, the beam generator including: a proton beam generator able to produce a proton beam having a uniform magnetic field by uniformly orienting the protons in the proton beam; an electron beam generator able to produce an electron beam having a uniform magnetic field by uniformly orienting the electrons in the electron beam; wherein the proton beam generator and the electron beam generator are coupled to a controller, and further wherein the proton beam generator and the electron beam generator are controllable to supply beams of equal particle densities; and at least one of: a first modulator, able to concurrently modulate the uniformly-oriented proton beam and the uniformly-oriented electron beam by concurrently influencing the uniform magnetic field of the uniformly-oriented proton beam and the uniform magnetic field of the uniformly-oriented electron beam; and a combiner having a second modulator, able to produce and to modulate a combined beam comprised of the uniformly-oriented proton beam and the uniformly-oriented electron beam and having a combined-beam uniform magnetic field, wherein the second modulator is able to modulate the combined-beam by influencing the combined-beam uniform magnetic field. The invention includes a magnetic lens able to correlate the spin states of the electrons and the protons by: influencing the protons in the magnetically-modulated, uniformly-oriented, self-collimating combined beam towards a predetermined spin vector state; and influencing the electrons in the magnetically-modulated, uniformly-oriented self-collimating combined beam towards the predetermined spin vector state. The beam generator may further include a resonant cavity, able to: receive the magnetically-modulated, uniformly-oriented, self-collimating combined beam; modulate a cavity-generated resonant frequency electromagnetic carrier with said magnetically-modulated, electrically neutral, uniformly-oriented, self-collimating combined beam to produce a modulated cavity-generated resonant frequency electromagnetic signal; and provide an output aperture for said modulated cavity-generated resonant frequency electromagnetic signal. The beam generator may further includes a duplexer having a duplexer input aperture and a duplexer output aperture, able to receive the oscillating magnetically-modulated, uniformly-oriented combined beam through the duplexer input aperture and to receive another oscillating combined beam through the duplexer output aperture.

A magnetically modulated, spin vector correlated, beam generator for projecting electrically right, neutral, or left beams, the beam generator including: a first vacuum chamber in a vacuum housing; a proton beam generator positioned in the first vacuum chamber, able to produce a uniformly-oriented proton beam, the proton beam generator including: a proton source; an anode-coupled orientation tube able to; receive protons from the proton source; accelerate the received protons toward a proton output aperture; and orient the received protons into a uniform orientation; a first magnetic modulator, able to modulate the uniformly-oriented proton beam to form a magnetically-modulated uniformly-oriented proton beam; beam steering means, able to steer the magnetically-modulated uniformly-oriented proton beam towards the proton output aperture; and at least one hydrogen scrubber, able to assist in removing hydrogen from the magnetically-modulated uniformly-oriented proton beam.

A second vacuum chamber in the vacuum housing an electron beam generator positioned in the second vacuum chamber, able to produce a uniformly-oriented electron beam, the electron beam generator including: a electron source; a cathode-coupled orientation tube able to; receive electrons from the electron source; accelerate the received electrons toward an electron output aperture; and orient the received electrons into a uniform orientation; a second modulator, able to modulate the uniformly-oriented electron beam concurrently with the modulation of the proton beam; beam steering means, able to steer the magnetically-modulated uniformly-oriented electron beam towards the electron output aperture; and at least one hydrogen scrubber, able to assist in removing hydrogen from the magnetically-modulated uniformly-oriented electron beam; a combiner including first and second combiner input apertures aligned to the proton and electron output apertures, respectively, able to: receive the magnetically-modulated uniformly-oriented proton beam through the first combiner input aperture; receive the magnetically-modulated uniformly-oriented electron beam through the second combiner input aperture; and combine the magnetically-modulated uniformly-oriented proton beam and the magnetically-modulated uniformly-oriented electron beam into a magnetically-modulated uniformly-oriented combined beam that is electrically neutral, wherein the magnetically-modulated uniformly-oriented combined beam is comprised of substantially equal numbers of the protons and the electrons as discrete particles; a resonant cavity, having at least one resonant frequency, including: an aperture for receiving the magnetically-modulated uniformly-oriented combined beam; a magnetic lens able to impose uniform spin orientation on the electrons and on the protons in the magnetically-modulated uniformly-oriented combined beam to form the magnetically-modulated, spin-vector-correlated, uniformly-oriented combined beam; a ceramic resonator that is one of selectable or tunable to influence the at least one resonant frequency of the resonant cavity; and a cavity probe, able to supply at least one feedback signal to the controller, wherein the controller is able to control at least one state within the resonant cavity.

The combiner further includes a third modulator able to modulate the uniformly-oriented combined beam by influencing the uniform magnetic field of the combined beam. The beam generator wherein the uniform spin orientation is right, neutral, or left, dependent on the particular mission system requirements.

DETAILED DESCRIPTIONS OF THE DRAWINGS

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
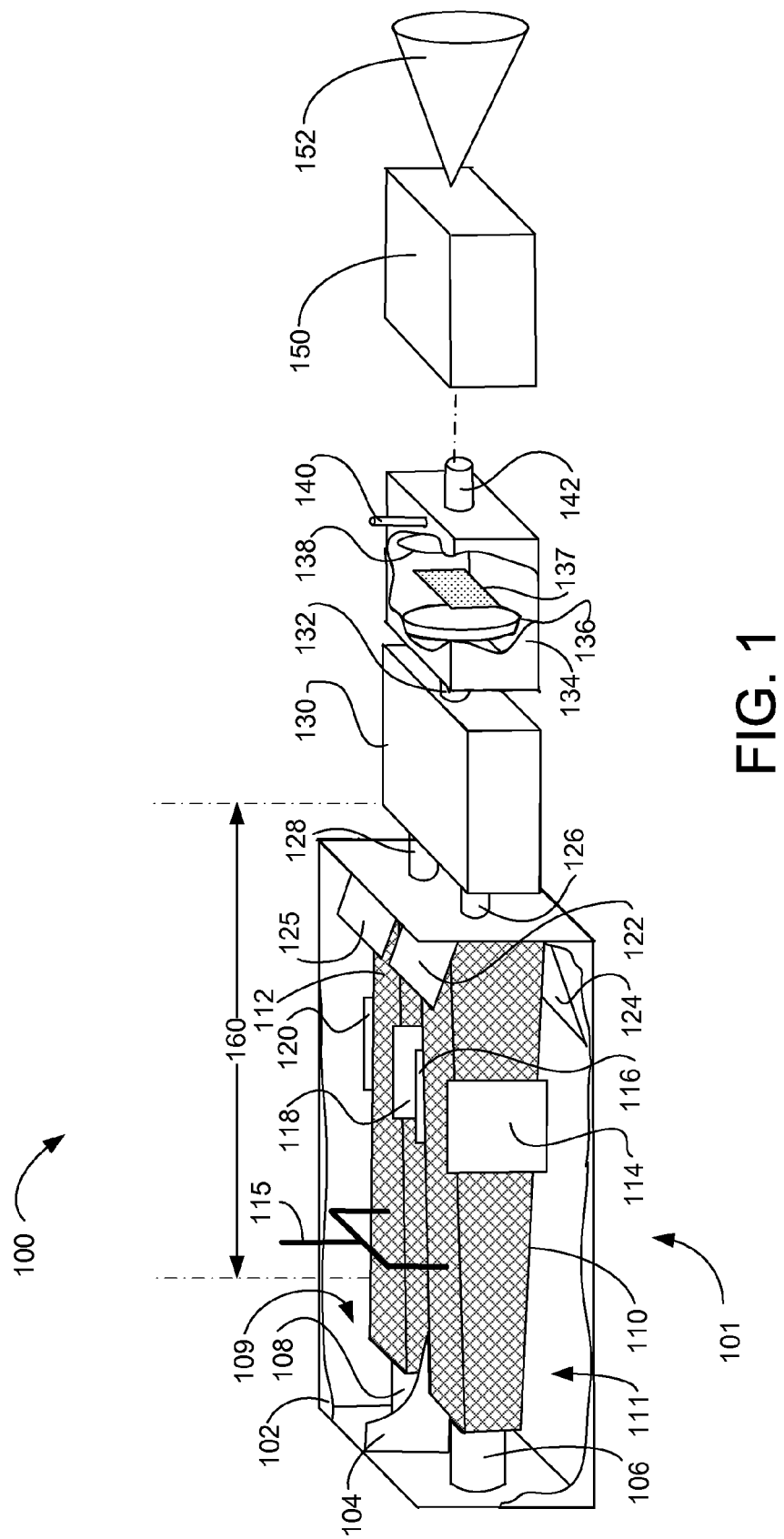
FIG. 1 is a side perspective diagrammatic view with cutaway portions illustrating an exemplary embodiment of a beam generator for producing magnetically-modulated, spin-vector correlated, electrically right, neutral, and left beams, according to an exemplary embodiment of the present invention.

FIG. 1 is a side perspective diagrammatic view with cutaway portions illustrating a beam generator 100 for producing magnetically-modulated, spin-vector correlated, electrically right, neutral, or left beams, according to an exemplary embodiment of the present invention. Dual particle source 101 is shown in cutaway portion to assist in illustrating the interior working of the beam generator 100. Vacuum housing 102 encases dual particle source 101. Partition 104, shown cut away, divides the vacuum chamber housing 102 into two separate vacuum chambers 109 and 111. Vacuum chamber housings 102 are typically fitted with vacuum line fittings and electrical connections to provide connectivity into the vacuum chamber housing 102. Vacuum chamber housings 102 are commercially available. For example, those produced by Nu Vacuum Systems Inc., 23 Joseph St., Kingston Mass. may serve in a particular embodiment. For various other embodiments, other vacuum chamber housings 102, or vacuum chamber housings 102 that have been specifically designed for a particular embodiment may be used. Those skilled in the art, upon reading the teachings of this specification, will appreciate that, under appropriate circumstances, considering such issues as beam generator 100 size, mass, and environmental constraints, other or additional vacuum chamber housings 102, such as higher or lower vacuum capacity, etc., may be used with beam generator 100.

In vacuum chamber 111, proton source 106 produces a proton stream. Proton sources, such as proton source 106, with their associated control systems, are available from Kimbal Physics, Inc. 311 Kimball Hill Road, Wilton, N.H. Protons may be produced by the ionization of hydrogen. The most common isotope of hydrogen has no neutron and consists of a proton and an electron. Accordingly, the ionization of hydrogen produces a hydrogen ion, which is usually a proton (in chemistry, designated H+). Preferably, the proton source 106 extends outside of the vacuum chamber 111, and connects to a source of hydrogen (not shown) external to the vacuum chamber 111. In an alternative embodiment, the hydrogen may be supplied through a conduit (not shown) through vacuum chamber housing 102, into vacuum chamber 111 and into the proton source 106. Commercially available proton sources have controls for the gas supply, pumping rate, deflection, focus, and rastering. Thus the proton source 106 produces a controllable proton stream. The electrons removed from the hydrogen by ionization of hydrogen in the proton source 106 may be deflected using electrostatic deflection plates inside proton source 106, and are then removed. The protons are emitted into the drift space 160. For various other embodiments, other commercially available proton sources 106, or proton sources 106 that have been specifically designed for a particular embodiment, may be used. Those skilled in the art, upon reading the teachings of this specification, will appreciate that, under appropriate circumstances, considering such issues as beam generator 100 size, mass, and desired beam energy, other or additional proton sources 106, such as higher or lower capacity or energy, etc., may be used with beam generator 100.

The drifting protons from proton source 106 are accelerated into drift space 160 by the proton source 106 and by anode-coupled orientation tube 110, where the protons are oriented into a uniform orientation in which each of the protons in the stream acquires the same orientation of its magnetic pole as the other protons. This uniform orientation of the protons gives the proton stream a uniform magnetic field, which may be used to intensity modulate the proton beam. Anode-coupled orientation tube 110 is made of a conductive mesh material and is given a positive electrical charge by being connected to an anode. The interaction of the electric field of the anode-coupled orientation tube 110 with the drifting protons biases the protons to take on a desired uniform orientation. While the anode-coupled orientation tube 110 is illustrated as an expanding mesh tube, the anode-coupled orientation tube 110 may be of various shapes, adapted to the parameters (such as size, energy, and shape) of the specific vacuum chamber 111. A tapered shape for anode-coupled orientation tube 110, widening toward the proton aperture 126, is preferred.

In vacuum chamber 109, electron source 108 includes an electron emitter operable to produce a stream of electrons drifting into drift space 160 in vacuum chamber 109. Electron emitters conventionally operate by thermionic emission. The electron emitter may be any one of various commercially available designs, such as a Lanthanun Hexaboride emitter from Kimball Physics Inc., 311 Kimball Hill Road, Wilton, N.H. Commercially available electron emitters have control systems available that are customized for the particular electron emitter. Typical controls include beam focus, pulse, particle rate, deflection, and raster controls. The electron source 108 may include electrostatic plates for accelerating and directing the drift electrons produced by the electron emitter into a beam. For various other embodiments, other electron sources 108, or electron sources 108 that have been specifically designed for a particular embodiment, may be used. Those skilled in the art, upon reading the teachings of this specification, will appreciate that, under appropriate circumstances, considering such issues as beam generator 100 size, mass, and desired beam energy, other or additional electron sources 108, such as higher or lower capacity or energy, etc., may be used with beam generator 100.

The drifting electrons from electron source 108 are accelerated into drift space 160 by the electron source 108 and cathode-coupled orientation tube 112, where the electrons are oriented into a uniform orientation in which each of the electrons in the stream acquires the same orientation of its magnetic pole as the other electrons. This uniform orientation of the electrons gives the electron stream a uniform magnetic field, which may be used to intensity modulate the electron beam. Cathode-coupled orientation tube 112 is made of a conductive mesh material and is given a negative electrical charge by being connected to a cathode. The interaction of the electric and magnetic field of the cathode-coupled orientation tube 112 with the drifting electrons biases the electrons to take on a desired uniform orientation. While the cathode-coupled orientation tube 112 is illustrated as an expanding tube, the cathode-coupled orientation tube 112 may be of various shapes, adapted to the parameters (such as size, energy, and shape) of the specific vacuum chamber 109. A tapered shape for cathode-coupled orientation tube 112, widening toward the electron aperture 128, is preferred.

The proton beam generator and the electron beam generator are controllable to supply beams of equal particle densities. This is essential to ultimately creating an electrically neutral beam made up of equal numbers of positively charged protons and negatively charged electrons. Generating a charged-particle beam that is electrically neutral is a novel aspect of the present invention.

Modulation signal conduit 115 has a splitter and is connected to modulators 202 (see FIG. 2) located inside, and electrically isolated from, each orientation tube 110 and 112. The modulation signal conduit 115 receives a mission modulation signal from a mission package, and concurrently magnetically modulates the intensity of both the proton stream and the electron stream based on the mission modulation signal. The modulation may include any modulation known to be imposed on a radar, communications, or surveillance carrier, including, for example, coding for a radar beam.

In an alternate embodiment, electrostatic grids may be used as modulators 202 in the charged beams. The electrostatic grids require opposite polarities to concurrently modulate. The splitter includes an inverter on one side, such that the mission modulation signal, when going positive in the electron stream goes negative in the proton stream, thereby concurrently imposing the same intensity modulation on each stream.

Electrostatic plates 114 and 116 steer the oriented proton beam toward proton aperture 126 through hydrogen scrubbers 123 and 124. The electrostatic plates 114 and 116 operate in pairs, as is known in the art, to steer and focus the proton beam toward the proton aperture 126. While the electrostatic plates 114 and 116 are shown diagrammatically as vertically oriented, any useful orientation, adapted to the size and shape of the particular vacuum chamber 111, may be used. Additional pairs of electrostatic plates, situated perpendicular to electrostatic plates 114 and 116 may also be used to provide two-axis control the proton beam. Those skilled in the art, upon reading the teachings of this specification, will appreciate that, considering such issues as beam generator size, shape, and desired beam energy, other arrangements of electrostatic plates 114 and 116, such as a linear sequence of deflection plates 114 and 116, adaptive shapes, sizes, materials, and designs, etc., may be used with beam generator 100.

The hydrogen scrubbers 123 and 124 assist in scrubbing ambient hydrogen out of the magnetically-modulated uniformly-oriented proton beam. The ionization of hydrogen is not always perfect, and the proton source 106 may introduce a small amount of un-ionized hydrogen into the proton beam. In addition, a proton in the beam may encounter a stray electron and change from its ionic state. In order to maintain beam purity, hydrogen scrubbers 123 and 124 are situated near the proton aperture 126 to catch any hydrogen in the magnetically-modulated uniformly-oriented proton beam. Preferably, the electrostatic deflection plates 114 and 116 deflect the protons through the proton aperture 126 but do not deflect the hydrogen through the proton aperture, leading the hydrogen to hit the hydrogen scrubbers 123 and 124. While the diagrammatic view of FIG. 1 shows upper and lower hydrogen scrubbers 123 and 124, various geometries and various numbers of hydrogen scrubbers 123 and 124 may be used. Preferably, the hydrogen scrubbers 123 and 124 surround the proton aperture 126 sufficiently to scrub any hydrogen out of the magnetically-modulated uniformly-oriented proton beam.

In a particular embodiment, the hydrogen scrubbers 123 and 124 may be made of palladium, which has a high affinity for hydrogen. Palladium hydrogen scrubbers 123 and 124 are commercially available. For example, palladium hydrogen scrubbers 123 and 124 producible by Engelhard Corp. of Seneca, S.C., may be used in a particular embodiment. In other embodiments, palladium hydrogen scrubbers 123 and 124 may be replaced or augmented with thin-film hydrogen scrubbers 123 and 124. For example, the thin film hydrogen scrubbers 123 and 124 producible by Sarnoff Corporation 201 Washington Road CN5300, Princeton, N.J., may suffice in particular embodiments.

Electrostatic plates 118 and 120 steer the magnetically-modulated uniformly-oriented electron beam toward electron aperture 128 through hydrogen scrubbers 122 and 125. The electrostatic plates 118 and 120 operate in pairs, as is known in the art, to deflect and focus the magnetically-modulated uniformly-oriented electron beam toward the electron aperture 128. While the electrostatic plates 118 and 120 are shown diagrammatically as vertically oriented, any useful orientation, adapted to the size and shape of the vacuum chamber 109, may be used. Additional pairs of electrostatic plates 118 and 120, situated perpendicular to electrostatic plates 118 and 120 may also be used to provide two-axis control of the magnetically-modulated uniformly-oriented electron beam. Those skilled in the art, upon reading the teachings of this specification, will appreciate that, considering such issues as beam generator size, shape, and desired beam energy, other arrangements of electrostatic plates 118 and 120, such as a linear sequence of electrostatic plates 118 and 120, adaptive shapes, sizes, materials, and designs, etc., may be used with beam generator 100.

The hydrogen scrubbers 122 and 125 assist in scrubbing ambient hydrogen out of the magnetically-modulated uniformly-oriented electron beam. The electron source 108 may introduce a small amount of hydrogen into the electron beam. In order to maintain beam purity, hydrogen scrubbers 122 and 125 are situated near the electron aperture 128 to catch any hydrogen in the magnetically-modulated uniformly-oriented electron beam. Preferably, the electrostatic deflection plates 118 and 120 deflect the electrons through the electron aperture 128 but do not deflect the hydrogen through the electron aperture 128, leading the hydrogen to hit the hydrogen scrubbers 122 and 125. While the diagrammatic view of FIG. 1 shows upper and lower hydrogen scrubbers 122 and 125, various geometries and various numbers of hydrogen scrubbers 122 and 125 may be used. Preferably, the hydrogen scrubbers 122 and 125 surround the electron aperture 128 sufficiently to scrub any hydrogen out of the magnetically-modulated uniformly-oriented electron beam.

In a particular embodiment, the hydrogen scrubbers 122 and 125 may be made of palladium, which has a high affinity for hydrogen. Palladium hydrogen scrubbers 122 and 125 are commercially available. For example, palladium hydrogen scrubbers 122 and 125 producible by Engelhard Corp. of Seneca, S.C., may be used in a particular embodiment. In other embodiments, palladium hydrogen scrubbers 122 and 125 may be replaced or augmented with thin-film hydrogen scrubbers 122 and 125. For example, the thin film hydrogen scrubbers 122 and 125 producible by Sarnoff Corporation 201 Washington Road CN5300, Princeton, N.J., may suffice in particular embodiments.

Proton source 106 and electron source 108 are preferably concurrently controlled to assist in producing equal numbers of electrons and protons at equal rates. Accordingly, the combined magnetically-modulated uniformly-oriented beams will be electrically neutral. The production amount and rate of protons and electrons may also be controlled to assist in creating a desired mission beam. Because the orientation of the electrons and protons in their respective beams is uniform, the beams each have a uniform magnetic field. Accordingly, the beams may be magnetically modulated by modulating an external magnetic field that influences the beams. In a particular preferred embodiment, the modulating field is created within vacuum chambers 109 and 111, as shown with modulators 202. Thus, creation of mission waveform characteristics and magnetic modulation of the oriented proton beam and oriented electron beam may be accomplished in vacuum chambers 111 and 109, respectively. Not all embodiments provide magnetic modulation in the vacuum chambers 109 and 111. For example, as described above, electrostatic grids 202 may be used to concurrently modulate the beams. In a particular preferred embodiment, the uniformly-oriented combined beam, discussed below, is magnetically modulated in the combiner 130. In yet another preferred embodiment, magnetic modulation of the uniformly-oriented combined beam takes place in the combiner 130 in addition to either magnetic or electrostatic modulation of the individual uniformly-oriented proton and electron beams.

Combiner 130 combines the magnetically-modulated uniformly-oriented proton beam and the concurrently magnetically-modulated uniformly-oriented electron beam to produce an electrically neutral beam at combined beam aperture 132. The combiner 130 may use any method known in the art, such as electrostatic deflection, magnetic deflection, or both, to combine the beams. Control of the combining process is preferably by computer control (discussed in regard to FIG. 4) of combiner 130 operating parameters. In an alternate embodiment, introduction of mission waveform characteristics and modulation of the neutral beam may be accomplished in combiner 130. An electrostatic or magnetic field emanating from between the two magnetically-modulated uniformly-oriented beams will bend the magnetically-modulated uniformly-oriented beams in opposite directions, and so can be used to bring the beams together. Additional deflection may be used, in particular embodiments, to align the magnetically-modulated uniformly-oriented combined beam.

While the proton beam and electron beams are combined spatially, there is very little collision between the electrons and protons, providing a charged particle beam that may impact an antenna without inducing a net charge on the antenna which might be sensed as a signal. Hence, interception of the signal is made more difficult. Combined with the self-collimating feature of the uniformly-oriented combined beam, the electrical neutrality of the beam makes interception of the output of the beam very difficult.

The beam at combined beam aperture 132 has a uniform magnetic field, vastly stronger than the electrical field produced by the negative and positive charges of the electrons and protons, respectively, that form the beam. Accordingly, the beam at combined beam aperture 132 is self-collimated by its own magnetic field and does not require magnetic focusing. This results in overall energy efficiencies above 95% for producing a collimated beam that can be projected over great distances. Beams of very high energies can be efficiently created for communicating over large distances, and for other purposes for which very high energy particle beams may be used.

Combiners 130 are commercially available for various portions of the electromagnetic spectra. For example, the products of Cadco Systems, 2363 Merritt Drive, Garland, Tex. may be used in particular embodiments. For various other embodiments, other combiners 130, or combiners 130 that have been specifically designed for a particular embodiment, may be used. Those skilled in the art, upon reading the teachings of this specification, will appreciate that, under appropriate circumstances, considering such issues as beam generator 100 size, mass, and desired beam energy, other or additional combiners 130, such as higher or lower capacity or energy, etc., may be used with beam generator 100.

In the illustrated embodiment, the magnetically-modulated, uniformly-oriented, self-collimating, combined beam enters the resonant cavity 134, shown in a cut away diagrammatic view, where the combined oriented beam magnetically influences, or modulates, a resonant RF signal in the resonant cavity 134. In RF embodiments, the resonant cavity 134 may be, for example, a suitably modified klystron or magnetron. The information modulated onto the RF beam may only be received by a receiver using complementary technology, and would be invisible to legacy RF receivers. Resonant cavities for portions of the electromagnetic spectra other than RF may be used in various alternate embodiments. Resonant cavity 134 may be a single-frequency cavity resonator 134 or a tunable cavity resonator 134, depending on the application for the particular embodiment. Cavity resonator 134 is preferably a high-Q cavity resonator 134, with a Q above 2000. Cavity resonators are commercially available. For example, cavity resonators 134 producible by Dielectric Laboratories Inc., 2777 Route 20 East, Cazenovia, N.Y., may be used in particular embodiments. Various resonant cavities 134 may be used for respective various embodiments. Those skilled in the art, upon reading the teachings of this specification, will appreciate that, considering such issues as frequency stability, frequency range, and beam power, various designs of resonant cavities 134, such as for RF, optical, terahertz, or IR frequencies, etc., may be used with beam generator 100.

Quadropole magnetic lens 136, oriented with its poles perpendicular to the direction of the beam velocity, ensures that the particles (protons and electrons) have, or attain, the desired spin orientation. For example, the output beam may be given a left, neutral, or right spin orientation, depending on the control inputs to the magnetic lens 136. Imposing left spin requires significant investment of energy and may reduce the efficiency of the beam generator 100 to less than 95%. Magnetic lenses 136 are commercially available. For example, a magnetic lens 136 producible by COMSOL, Inc., 10850 Wilshire Boulevard, Suite 800, Los Angeles, Calif., may be used in a particular embodiment. In various other embodiments, other commercially available magnetic lenses 136, or a custom-designed magnetic lens 136, may be used.

Ceramic resonator 137 is selected based on the desired single or tunable frequency. Ceramic resonator 137 is used to change the cavity dimensions of the resonant cavity and, therefore, the frequency of the final output beam. Ceramic resonator 137 may be static, to maintain a single frequency, or may be controllable to change the resonant frequency, as desired.

Receiving antenna 138 may be used to receive incoming signals through the duplexer 150. In a preferred embodiment, the receiving antenna 138 may be a wire loop receiving antenna 138. In an alternate embodiment, the receiving antenna 138 may be a stub receiving antenna 138, such as those available from Comtech House, 28 Manchester Road, Westhoughton, Bolton, Lancashire.

Cavity probe 140 is operable to supply data regarding the state vector correlation of the particles in the resonant cavity 134. Such state vector correlation data is used to control the inputs to the beam generator 100. Such cavity probes are commercially available. For example, a cavity probe 134 such as one available from Kimball Physics Inc., 311 Kimball Hill Road, Wilton, N.H. In various other embodiments, other cavity probes 140 or cavity probes 140 specifically designed for a particular alternate embodiment, may be used. In a preferred embodiment, cavity probe 140 provides information on more than one state of interest inside the cavity.

The combined, oriented, magnetically modulated, magnetically focused electrically right, neutral, or left beam with a cavity-resonant frequency imposed thereon exits through cavity resonator aperture 142 and, optionally, into a legacy duplexer 150 and legacy aperture 152.

The embodiment described above is for embodiments of beam generation device 100 for creating electrically right, neutral, or left, magnetically modulated beams. No limitation as to the upper or lower limits on size or output power should be inferred form the above description.

Figure 2:
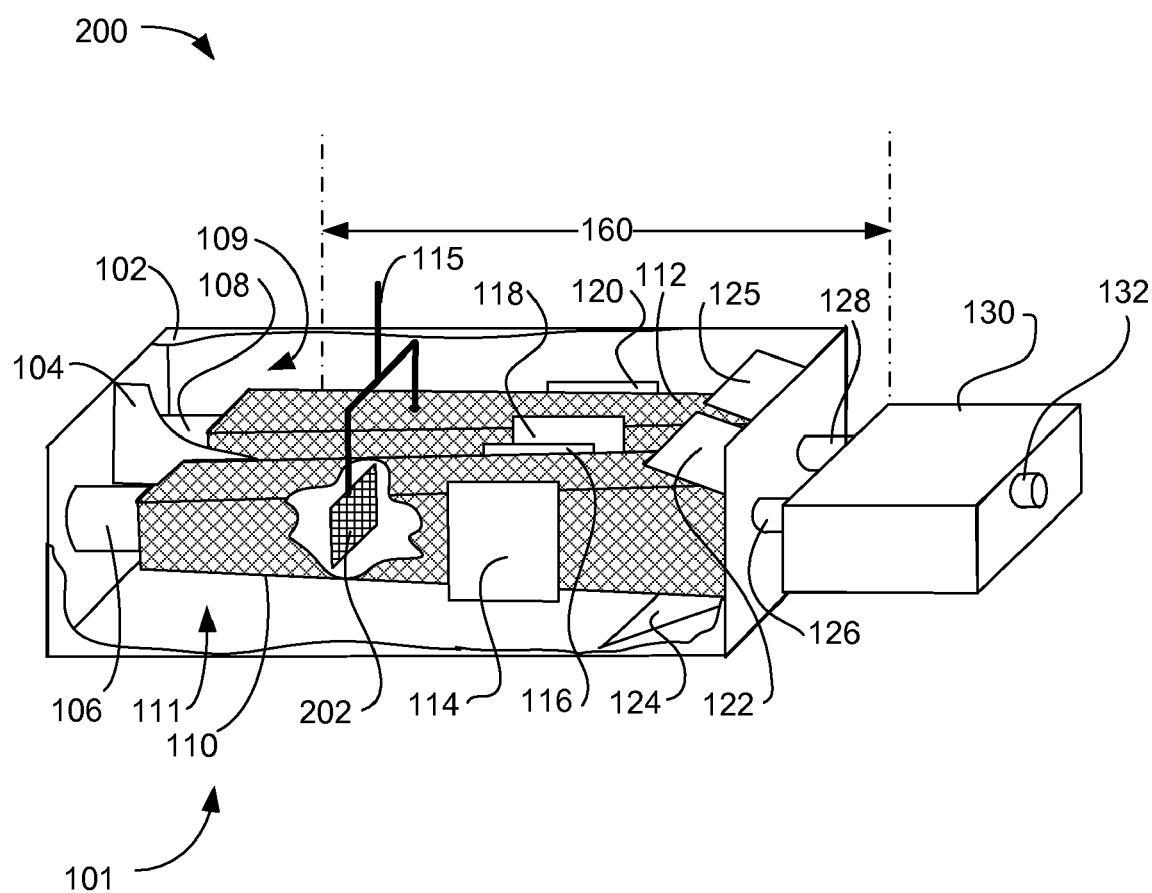
FIG. 2 is a side perspective diagrammatic view with cutaway portions illustrating an exemplary embodiment of a dual-particle source and combiner, according to an exemplary embodiment of the present invention.

FIG. 2 is a side perspective view with cutaway portions illustrating an exemplary embodiment of a beam generator 100 for producing a magnetically-modulated, electrically neutral, uniformly-oriented, sel-collimating, particle beam, according to an exemplary embodiment of the present invention. By removing the cavity resonator 134 and all components therein and downstream there from, from the embodiment in FIG. 1, a magnetically modulated, electrically neutral, uniformly-oriented, self-collimating, particle beam generator 200 may be formed from dual-particle source 101 and combiner 130. A combined, uniformly-oriented, magnetically-modulated, self-collimating beam produced by generator 200 may be used in various applications. In an alternate embodiment, a combined, uniformly-oriented, magnetically-modulated, self-collimating, high-energy particle beam may transfer energy to an object over vast distances in outer space.

Modulators 202 (one shown) receive a mission modulation signal through conduit 115, which includes a splitter. A bias magnetic field may be maintained on modulators 202 to assist in controlling the beam density. The modulation may be for various purposes in various embodiments. For example, in a radar application, coding, as is known in the art of radar, may be modulated onto the beam to further modulate an RF signal in a resonant cavity. In another example, a navigation coding may be modulated onto the beam to further modulate an RF signal from a navigation satellite. Those of skill in the art of electronic signals, enlightened by the present disclosure, will comprehend the vast number of applications for which the dual particle source 101 and combiner 130 may be used. For example, magnetically modulated, electrically neutral, uniformly-oriented, self-collimating, output of particle beam generator 200 may be fed into a free-electron laser system (FELS) and, with appropriate frequency input, a coherent photon stream of the same frequency emerges.

Figure 3:
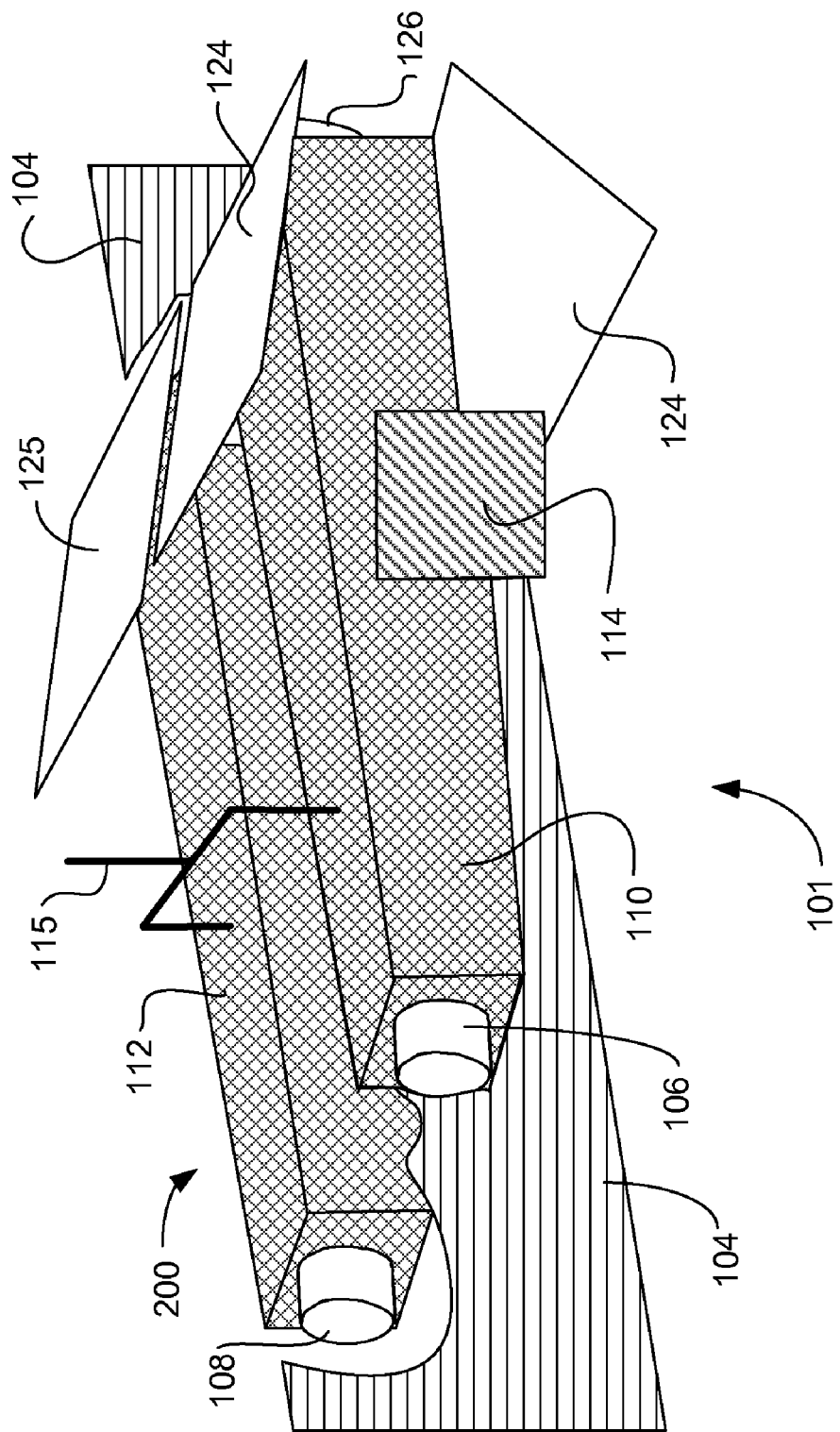
FIG. 3 is a perspective diagrammatic view of some details of the inner workings of a dual-particle source, according to an exemplary embodiment of the present invention.

FIG. 3 is a perspective diagrammatic view of some details of the inner workings of a dual-particle source 101, according to an exemplary embodiment of the present invention. The dual-particle source 101 is controllable to produce coordinated beams of oriented electrons and oriented positively charged ions, including $H^+$ ions, or protons. In a particular embodiment, magnetic modulation of the beams may be performed in dual-particle source 101, as by a mission modulation signal introduced through conduit 115. In an alternate embodiment, electrostatic modulation may be used.

Figure 4:
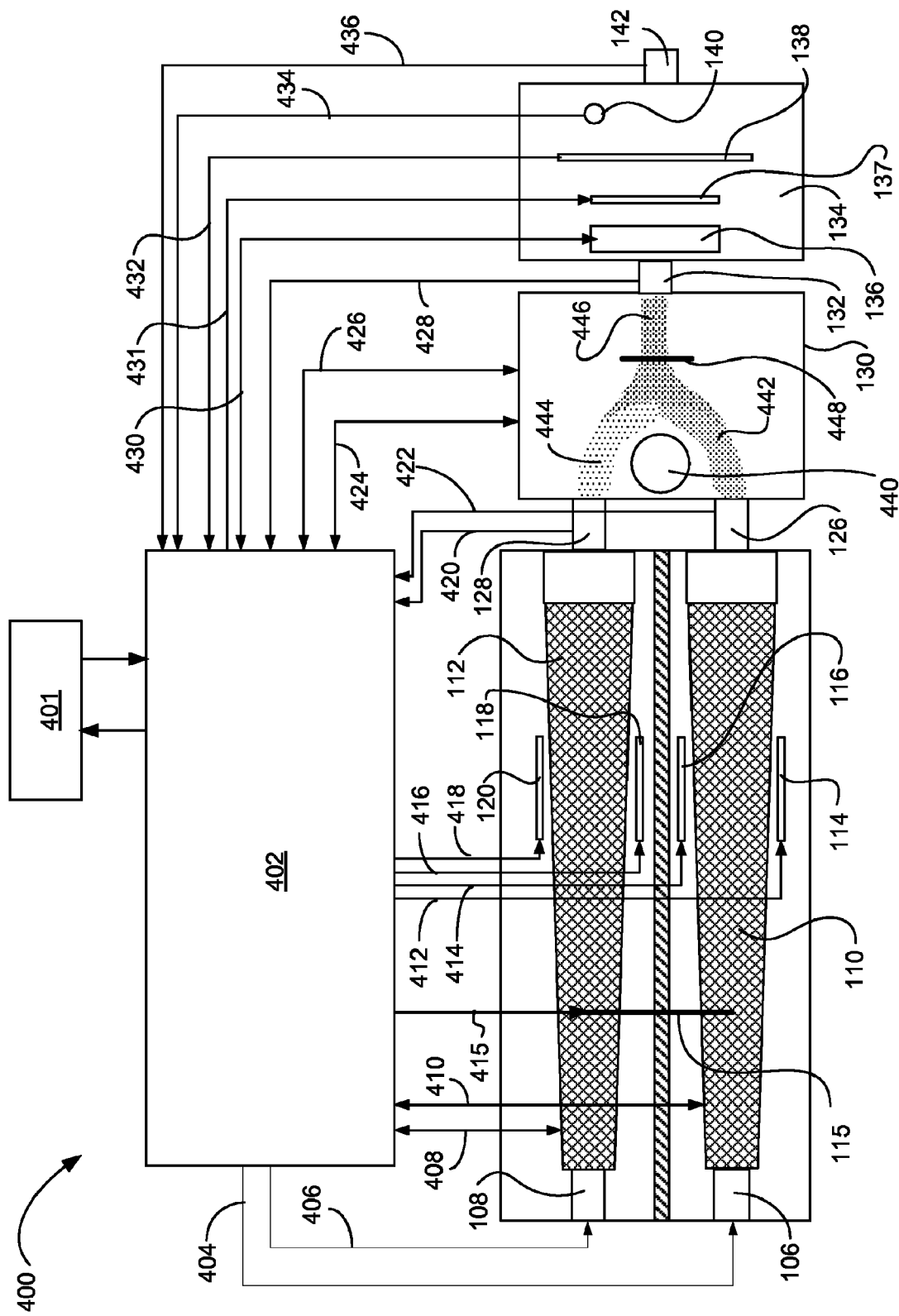
FIG. 4 is a block diagram of the embodiment of FIG. 1 illustrating an exemplary controller, according to an exemplary embodiment of the present invention.

FIG. 4 is a block diagram of the embodiment of FIG. 1 illustrating an exemplary controller 402, according to an exemplary embodiment of the present invention. Controller 402 may be an executive, or management program, for individual device controllers for the devices that make up the beam generator 100 as shown in FIG. 1. In other embodiments, controller 402 may be a direct controller 402 for all devices and also have an executive function. Controller 402 may receive inputs from and send data to human-machine interface 401. Human-machine interface 401 may be a personal computer, workstation, terminal, telemetry interface, or the like, where operation of the beam generator 100 may be monitored and changes to operational parameters may be entered by a person.

In physical form, controller 402 may be the system computer, single board computer, or a standalone device control board that hosts open firmware, characterized as software embedded hardware using electrically erasable programmable read-only memory (EEPROM) chipsets. The utility of choosing the EEPROM chipsets is that it allows remote (external) modification to operating code via human-machine-interface 401. The firmware will provide device level control and monitoring of: on/off states; metering electron, proton or other ion production and particle balance; measuring and reporting chamber 109 and 111, combiner 130, and cavity 134 flow, thermal and pressure states and, most importantly, respond to external command and control and manage the magnetic lens 136 in spin vector correlation of the beam. As a additional mission support feature either single board computer or EEPROMS can be programmed and implemented to support device or system diagnostics and built-in-test (BIT) on more complex system designs. The EEPROM is preferably designed and packaged to satisfy system environmental, reliability, sustainability, and maintainability requirements. An exemplary firmware supplier is Invisar, Inc., Hillsborough, N.C.—USA. An alternative for open firmware is a single board computer such as those found at Centric Corporation 5700 Clifton Avenue Jacksonville, Fla. 32211.

In operation, controller 402 may control proton source 106 through varying power supplied along proton source power conduit 404, or through controls provided by the manufacturer, as discussed above. In an alternate embodiment, conduits are supplied to the proton source 106 for implementing controller commands to conduct signals for producing protons at the desired rate and energy. The signals are determined based on input/output curves supplied by the proton source 106 manufacturer, which may be refined by system measurements taken in the field. Controller 402 may control electron source 108 by varying power supplied along electron source power conduit 406 to provide signals for producing electrons at the desired rate and energy. The signals are determined based on input/output curves supplied by the electron source 108 manufacturer, which may be refined by system measurements taken in the field. Controller 402 maintains and controls the desired charge on anode-coupled orientation tube 110 through signal path 410. Controller 402 maintains and controls the desired charge on cathode-coupled orientation tube 112 through signal path 408. Deflection plates 114, 116, 118, and 120 are controlled as to their deflection voltages and waveforms by controller 402 through signal paths 412, 414, 416, and 418, respectively. The magnetically-modulated, uniformly-oriented proton beam 442 may be measured at proton aperture 126 and the measurement sent to controller 402 along signal path 422. The magnetically-modulated, uniformly-oriented electron beam 444 may be measured at electron aperture 128 and the measurement sent to controller 402 along signal path 420.

Controller 402 controls combiner 130 using signal paths 424 and 426 to establish the combination balance and form. Magnet 440 is oriented to deflect the magnetically-modulated, uniformly-oriented proton beam 442 and the magnetically-modulated, uniformly-oriented electron beam 444 to form magnetically-modulated, uniformly-oriented combined beam 446. In a particular embodiment, controller 402 may control magnetic modulator 448 in combiner 130. The magnetically-modulated, uniformly-oriented combined beam 446 is sensed at combined beam aperture 132 and the measurement data is sent to controller 402.

Quadropole magnetic lens 136 in resonant cavity 134 is controlled using signals to and from the controller over signal path 430 (four wires) to produce right, neutral, or left spin vector correlation for the magnetically-modulated, uniformly-oriented combined beam. Ceramic resonator 137 is controlled by signals carried over resonator conduit 431 (two wires). The output of loop antenna 138 may be sensed by controller 402 over signal path 432. In an alternate embodiment, the output of loop antenna 138 may be received by a discrete signal processor, (not shown). The output of cavity probe 140 is sent to controller 402 along signal path 434. Finally, the resonant cavity 134 output is sensed at the resonant cavity aperture 142 and the data sent to controller 402 via signal path 436. The signal paths shown in FIG. 4 may be of any appropriate type, as adapted to the operational environment in which the operational beam generator 100 may be used.

The final beam exiting resonant cavity aperture 142 is a magnetically-modulated, uniformly-oriented, electrically neutral, spin-vector correlated, frequency-selected combined beam of discrete protons and electrons (hereinafter "final beam"). The final beam, while intensity modulated, is concurrently modulated in the dual particle source 101 and/or magnetically modulated as a combined beam 446 in the combiner 130. Accordingly, the particle density of protons and electrons is equal at any point along the final beam, with the result that the final beam is undetectable to conventional antennas, as the final beam will not induce a net voltage on a conventional antenna when the beam impinges on the conventional antenna. A specialized receiver, able to detect the fluctuations in the beam kinetic energy resulting from the intensity modulation, is required for receiving communications over the beam. Conventional radar detectors, which rely on conventional antennas, would not be able to sense a radar implemented with the final beam.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

We claim:

1. A magnetically modulated, spin vector correlated, self-collimating beam generator for projecting electrically right, neutral, or left beams, said beam generator comprising:
   a. a proton beam generator operable to produce a proton beam having a uniform magnetic field by uniformly orienting said protons in said proton beam;
   b. an electron beam generator operable to produce an electron beam having a uniform magnetic field by uniformly orienting said electrons in said electron beam; and
   c. wherein said proton beam generator and said electron beam generator are coupled to a controller, and further wherein said proton beam generator and said electron beam generator are controllable to supply beams of equal particle densities.

2. The beam generator of claim 1, wherein said proton beam generator comprises:
   a. a proton source;
   b. an anode-coupled orientation tube operable to;
      i. receive said protons from said proton source;
      ii. accelerate said received protons toward a proton aperture; and
      iii. orient said received protons into a uniform orientation.

3. The beam generator of claim 2, wherein said proton beam generator further comprises:
   a. a proton-beam magnetic modulator, operable to magnetically modulate said uniformly-oriented proton beam;
   b. first beam steering means, operable to steer said magnetically-modulated, uniformly-oriented proton beam towards said proton aperture; and
   c. at least one first hydrogen scrubber, operable to assist in removing hydrogen from said magnetically-modulated, uniformly-oriented proton beam.

4. The beam generator of claim 1, wherein said electron beam generator comprises:
   a. an electron source;
   b. a cathode-coupled orientation tube operable to:
      i. receive said electrons from said electron source;
      ii. accelerate said received electrons toward an electron aperture; and
      iii. orient said received electrons into a uniform orientation.

5. The beam generator of claim 4, wherein said electron beam generator further comprises:
   a. an electron-beam magnetic modulator, operable to concurrently magnetically modulate said uniformly-oriented electron beam;
   b. second beam steering means, operable to steer said magnetically-modulated, uniformly-oriented electron beam towards said electron aperture; and
   c. at least one second hydrogen scrubber, operable to assist in removing hydrogen from said magnetically-modulated, uniformly-oriented electron beam.

6. The beam generator of claim 1, further comprising at least one of:
   a. a first modulator, operable to concurrently modulate said uniformly-oriented proton beam and said uniformly-oriented electron beam by concurrently influencing said uniform magnetic field of said uniformly-oriented proton beam and said uniform magnetic field of said uniformly-oriented electron beam; and
   b. a second modulator, operable to modulate a combined beam comprised of said uniformly-oriented proton beam and said uniformly-oriented electron beam and having a combined-beam uniform magnetic field, wherein said second modulator is operable to magnetically modulate said uniformly-oriented combined beam by influencing said combined-beam uniform magnetic field.

7. The beam generator of claim 1, further comprising a combiner for combining said uniformly-oriented proton beam and said uniformly-oriented electron beam to produce an electrically neutral, uniformly-oriented, self-collimating combined beam having a combined-beam uniform magnetic field, wherein said protons and said electrons remain discrete particles in said electrically neutral, uniformly-oriented, self-collimating combined beam.

8. The beam generator of claim 7, further comprising a combined-beam modulator, operable to influence said combined-beam uniform magnetic field.

9. The beam generator of claim 7, further comprising a magnetic lens operable to correlate the spin states of said electrons and said protons by:
   a. influencing said protons in said magnetically-modulated, electrically neutral, uniformly-oriented combined beam towards a predetermined spin vector state; and
   b. influencing said electrons in said magnetically-modulated, electrically neutral, uniformly-oriented combined beam towards said predetermined spin vector state.

10. The beam generator of claim 9, wherein said predetermined spin vector state comprises left spin.

11. The beam generator of claim 7, further comprising a resonant cavity, operable to:
   a. receive said magnetically-modulated, electrically neutral, uniformly-oriented, self-collimating combined beam;
   b. modulate a cavity-generated resonant frequency electromagnetic carrier with said magnetically-modulated, electrically neutral, uniformly-oriented, self-collimating combined beam to produce a modulated cavity-generated resonant frequency electromagnetic signal; and
   c. provide an output aperture for said modulated cavity-generated resonant frequency electromagnetic signal.

12. The beam generator of claim 11, wherein said resonant cavity comprises:
   a. a magnetic lens operable to:
      i. influence said protons in said magnetically-modulated, electrically neutral, uniformly-oriented combined beam towards a predetermined spin vector state; and
      ii. influence said electrons in said magnetically-modulated, electrically neutral, uniformly-oriented combined beam towards said predetermined spin vector state;
   b. a ceramic resonator, selectable and controllable to determine a resonant frequency in said resonant cavity.

13. The beam generator of claim 12, wherein said resonant cavity further comprises:
   a. a receiving antenna, operable to receive signals entering said resonant cavity; and
   b. a probe, operable to sample at least one state within said resonant cavity.

14. The beam generator of claim 11, further comprising a duplexer having a duplexer input aperture and a duplexer output aperture, operable to receive said oscillating, magnetically-modulated, electrically neutral, uniformly-oriented, spin-vector correlated combined beam through said duplexer input aperture and to receive another oscillating combined beam through said duplexer output aperture.

15. A magnetically modulated, spin vector correlated, self-collimating beam generator for projecting electrically right, neutral, or left beams, said beam generator comprising:
   a. a proton beam generator operable to produce a proton beam having a uniform magnetic field by uniformly orienting said protons in said proton beam;
   b. an electron beam generator operable to produce an electron beam having a uniform magnetic field by uniformly orienting said electrons in said electron beam;
   c. wherein said proton beam generator and said electron beam generator are coupled to a controller, and further wherein said proton beam generator and said electron beam generator are controllable to supply beams of equal particle densities; and
   d. at least one of:
      i. a first modulator, operable to concurrently modulate said uniformly-oriented proton beam and said uniformly-oriented electron beam by concurrently influencing said uniform magnetic field of said uniformly-oriented proton beam and said uniform magnetic field of said uniformly-oriented electron beam; and
      ii. a combiner having a second modulator, operable to produce and to modulate a combined beam comprised of said uniformly-oriented proton beam and said uniformly-oriented electron beam and having a combined-beam uniform magnetic field, wherein said second modulator is operable to modulate said combined-beam by influencing said combined-beam uniform magnetic field; and
   e. a magnetic lens operable to correlate the spin states of said electrons and said protons by:
      i. influencing said protons in said magnetically-modulated, uniformly-oriented combined beam towards a predetermined spin vector state; and
      ii. influencing said electrons in said magnetically-modulated, uniformly-oriented combined beam towards said predetermined spin vector state.

16. The beam generator of claim 15, further comprising a resonant cavity, operable to:
  a. receive said magnetically-modulated, uniformly-oriented combined beam;
  b. modulate a cavity-generated resonant frequency electromagnetic carrier with said magnetically-modulated, electrically neutral, uniformly-oriented, self-collimating combined beam to produce a modulated cavity-generated resonant frequency electromagnetic signal; and
  c. provide an output aperture for said modulated cavity-generated resonant frequency electromagnetic signal.

17. The beam generator of claim 16, further comprising a duplexer having a duplexer input aperture and a duplexer output aperture, operable to receive said oscillating magnetically-modulated, uniformly-oriented combined beam through said duplexer input aperture and to receive another oscillating combined beam through said duplexer output aperture.

18. A magnetically modulated, spin vector correlated, beam generator for projecting electrically right, neutral, or left beams, said beam generator comprising:
  a. a first vacuum chamber in a vacuum housing;
  b. a proton beam generator positioned in said first vacuum chamber, operable to produce a uniformly-oriented proton beam, said proton beam generator comprising:
     i. a proton source;
     ii. an anode-coupled orientation tube operable to:
        1. receive protons from said proton source;
        2. accelerate said received protons toward a proton output aperture; and
        3. orient said received protons into a uniform orientation;
     iii. a first magnetic modulator, operable to modulate said uniformly-oriented proton beam to form a magnetically-modulated uniformly-oriented proton beam;
     iv. beam steering means, operable to steer said magnetically-modulated uniformly-oriented proton beam towards said proton output aperture; and
     v. at least one hydrogen scrubber, operable to assist in removing hydrogen from said magnetically-modulated uniformly-oriented proton beam;
  c. a second vacuum chamber in said vacuum housing;
  d. an electron beam generator positioned in said second vacuum chamber, operable to produce a uniformly-oriented electron beam, said electron beam generator comprising:
     i. a electron source;
     ii. a cathode-coupled orientation tube operable to:
        1. receive electrons from said electron source;
        2. accelerate said received electrons toward an electron output aperture; and
        3. orient said received electrons into a uniform orientation;
     iii. a second modulator, operable to modulate said uniformly-oriented electron beam concurrently with said modulation of said proton beam;
     iv. beam steering means, operable to steer said magnetically-modulated uniformly-oriented electron beam towards said electron output aperture; and
     v. at least one hydrogen scrubber, operable to assist in removing hydrogen from said magnetically-modulated uniformly-oriented electron beam;
  e. a combiner comprising first and second combiner input apertures aligned to said proton and electron output apertures, respectively, operable to:
     i. receive said magnetically-modulated uniformly-oriented proton beam through said first combiner input aperture;
     ii. receive said magnetically-modulated uniformly-oriented electron beam through said second combiner input aperture; and
     iii. combine said magnetically-modulated uniformly-oriented proton beam and said magnetically-modulated uniformly-oriented electron beam into a magnetically-modulated uniformly-oriented combined beam that is electrically neutral, wherein said magnetically-modulated uniformly-oriented combined beam is comprised of substantially equal numbers of said protons and said electrons as discrete particles;
  f. a resonant cavity, operable to generate at least one resonant carrier frequency, comprising:
     i. an aperture for receiving said magnetically-modulated uniformly-oriented combined beam;
     ii. a magnetic lens operable to impose uniform spin orientation on said electrons and on said protons in said magnetically-modulated uniformly-oriented combined beam to form said magnetically-modulated, spin-vector-correlated, uniformly-oriented combined beam;
     iii. a ceramic resonator that is one of selectable and operable to influence said at least one resonant frequency of said resonant cavity; and
     iv. a cavity probe, operable to supply at least one feedback signal to said controller, wherein said controller is operable to control at least one state within said resonant cavity.

19. The beam generator of claim 18, wherein said combiner further includes a third modulator operable to modulate said uniformly-oriented combined beam by influencing said uniform magnetic field of said combined beam.

20. The beam generator of claim 18, wherein said uniform spin orientation is one of right and left.

* * * * *